United States Patent [19]

Matsubara

[11] Patent Number: 4,628,268
[45] Date of Patent: Dec. 9, 1986

[54] TEST DEVICE FOR TESTING AN ACTUATOR CIRCUIT

[75] Inventor: Takehiro Matsubara, Kobe, Japan

[73] Assignee: Mitsubishi Denki Kabushiki Kaisha, Tokyo, Japan

[21] Appl. No.: 534,300

[22] Filed: Sep. 21, 1983

[30] Foreign Application Priority Data

Nov. 18, 1982 [JP] Japan .................................. 58-204145

[51] Int. Cl.[4] .......................................... G01R 31/32
[52] U.S. Cl. ..................................................... 324/418
[58] Field of Search ................ 340/813; 324/416, 418; 361/3, 8, 58

[56] References Cited

U.S. PATENT DOCUMENTS 1,992,146  2/1935  Craig ..................................... 340/813
2,780,777  2/1957  Sammis ................................. 324/416
3,590,319  6/1971  Baltensperger ......................... 361/8
3,873,854  3/1975  Lamb ..................................... 361/58

OTHER PUBLICATIONS

RCA Transistor, Thyristor and Diode Manual: Technical Series SC-15, pp. 232-235, 1971, RCA Corporation.

Voltage Stabilizers by F. A. Benson: Electronics Engineering, London—1950 (pp. 9-11 and pp. 87-91).
"Engineered Safety Features Actuation Systems Follow-Up System Logic," I.EEE, vol. NS-27, No.-1, Feb. 1980, pp. 859-860, S. V. Athavale et al.

Primary Examiner—Reinhard J. Eisenzopf
Assistant Examiner—Jack B. Harvey
Attorney, Agent, or Firm—Leydig, Voit & Mayer, Ltd.

[57] ABSTRACT

A test device for testing an actuator circuit without operating an actuator in the circuit to determine whether the circuit is operating normally comprises a relay input and a relay output which are electromagnetically coupled or optically coupled. The relay input is connected in series with a test circuit power supply for initiating the test and operating the relay output which is connected with an actuator power supply and an actuator. A voltage limiting device is connected in series with the relay output for limiting the magnitude of the voltage supplied to the actuator at testing time so that the actuator is not operated. The test circuit power supply further includes a pulse generating circuit for generating a signal pulse having a pulse width less than a predetermined pulse width normally required to operate the actuator.

10 Claims, 6 Drawing Figures

4,628,268

TEST DEVICE FOR TESTING AN ACTUATOR CIRCUIT

BACKGROUND OF THE INVENTION

This invention relates to a test device for testing an actuator or a circuit which has an actuator without actually operating the actuator.

FIGS. 1 to 3 show prior-art test devices of this type. A test device for testing an actuator in FIG. 1 does not necessitate a testing implement. Numeral 11 designates a switch which is externally controlled in its ON and OFF positions, and numeral 20 designates a relay such as an electromagnetic relay, the input of which comprises a relay coil 21 and the output of which comprises relay contact 22, being electromagnetically coupled. Numeral 12A designates a power supply for the circuit including the relay such as an A.C. power source, numeral 31 designates an actuator which is ordinarily stopped but is operated at a selected time such as a valve, or a motor breaker, and numeral 32D designates a power supply for the actuator such as a D.C. power supply.

The switch 11, the relay coil 21 of the relay 20 and the power source 12A for the relay form a first switching circuit 10, and the relay contacts 22 of the relay 20, the actuator 31 and the actuator power supply 32D for the actuator form an actuator circuit 30.

When the switch 11 is now externally controlled to be ON, the relay coil 21 of the relay 20 is energized so that the relay contacts 22 are closed, thereby causing the actuator 31 to be operated.

In case that the actuator is very important in the operation of a plant, or that the actuator is indispensable for protecting a human body, it is necessary to test the actuator or circuit which includes the actuator periodically to determine whether they are operating normally or abnormally. When the actuator does not affect the influence to the operation of the plant even if the actuator is operated, the testing method is simple, and the actuator is actually operated as described with reference to FIG. 1.

However, when the operation of the actuator seriously affects the influence to the operation of the plant, a test device for testing the actuator is used as shown in FIG. 2.

In FIG. 2, numerals 10, 11, 12A, 20, 21, 22, 31 and 32D designate the same parts shown in FIG. 1. The test device in FIG. 2 is different from that in FIG. 1 in that a block contact 33 used at testing time, an indicator lamp 34 used at testing time and having terminals 1, 2 and 3 as well as a push-button W, and a resistor 35 have been added. The block contact 33 is normally ON, and the indicator lamp 34 is so constructed that, when a current flows from the terminal 1 to the terminal 2, the indicator lamp 34 is lit. However, when the block contact 33 is opened (OFF position), the indicator lamp 34 lights only when the push-button W is depressed, and current flows from the terminal 3 to the terminal 1. In the state shown in FIG. 2, the block contact 33 is ON, and a current, accordingly, flows from the terminal 1 to the terminal 2 of the indicator lamp 34, with the result that the indicator lamp 34 is lighted. When the block contact 33 is turned OFF and the push-button W is not depressed, no current flows through the indicator lamp 34, and the lamp 34, accordingly, is turned OFF. When the switch 11 is turned ON to carry out a test after the fact that the indicator lamp 34 is off is confirmed, the relay coil 21 is energized so that the relay contacts 22 are closed (ON position). When the push-button W is then depressed, a current flows from the positive terminal of the power supply 32D for the actuator through the terminal 3 of the indicator lamp 34, the terminal 1, the relay contact 22 and the actuator 31 to the negative terminal of the power supply 32D for the actuator, so that the indicator lamp 34 is turned ON.

A test device for testing an actuator has employed a semiconductor relay and a photocoupler as illustrated in FIG. 3 instead of the electromagnetic relay illustrated in FIG. 1 wherein, as a test implement, a pulse generating circuit serves as a power supply for testing by pulses is utilized. More particularly, numerals 11, 31 and 32D are the same as those in FIG. 1. Numeral 20D designates a photocoupler which consists of a light emitting diode 23 and a phototransistor 24 formed in such a manner that the input and the output are optically, i.e., electromagnetically coupled. Numeral 12D designates a power supply for the relay such as a D.C. power supply, the positive terminal of which is connected through a resistor 13 to the anode of the light emitting diode 23, and the cathode of this light emitting diode 23 is connected through a switch 11 to the negative terminal of the power supply 12D. A pulse generating circuit 14 for generating an ON signal is connected between both ends of the switch 11 for a short time at the testing time. Numeral 36 designates a power transistor for driving the actuator 31 by amplifying the output of the photocoupler 20D, the emitter of which is connected to the positive terminal of the power supply 32D, and the base and collector of which are respectively connected to the collector and emitter of the phototransistor 24 in the photocoupler 20D. Numeral 37 designates a current pickup for detecting in a non-contact arrangement a current which flows through the actuator circuit 30 which includes the actuator 31. Numeral 38 designates a discriminating circuit connected to the current pickup 37 for discriminating whether the second closing circuit 30 is operating normally or abnormally by amplifying the output of the current pickup 37.

The operation of the test device under normal operating conditions will be first described.

When the switch 11 is turned ON so that the light emitting diode 23 in the photocoupler 20D emits a light, the phototransistor 24 thereby conducts, and the power transistor 36 accordingly conducts, with the result that the actuator 31 is operated.

Then, the operation of the test device under test conditions will be described.

Since the switch 11 is OFF in the ordinary operating conditions, the actuator 31 does not operate. However, when a signal pulse is generated from a pulse generating circuit 14 which has a pulse width shorter than the operating time of the actuator 31, a pulse current flows through the actuator circuit 30. This pulse current is detected by the current pickup 37, and the discriminating circuit 38 discriminates between normal and abnormal actuator circuit operation from the current value and the waveform of the pulse current.

Since the prior-art test device for testing the actuator is constructed as described above, it is necessary in case of the electromagnetic relay type device to add the block contact and the indicator circuit so that the test device itself becomes complicated with the result that it was difficult to automate the testing. Further, since the prior-art test device, in the case of the semiconductor type relay, does not have a movable contact like the block contact, the automation of the testing can be facilitated, but the actuator may be accidentally operated due to malfunction in the pulse generating circuit utilized as a test implement, which is a drawback because of the danger of affecting or exerting a large influence on the plant.

SUMMARY OF THE INVENTION

This invention has been made in order to eliminate the disadvantages described above, and provides a test device for testing an actuator circuit having an actuator power supply and a relay output in series with the actuator. The test device comprises a test circuit including a test circuit power supply and a relay input actuated by the test circuit power supply under test conditions. The relay input is coupled to operate the relay output to connect the actuator power supply to the actuator. The test device further comprises a voltage-limiting mechanism in the actuator circuit for limiting the voltage applied to the actuator from the actuator power supply under test conditions when the relay output is operated, a mechanism for detecting characteristics of current flow in the actuator circuit under test conditions and for discriminating between normal and abnormal circuit operation, and a mechanism connected in parallel with the voltage-limiting mechanism for bypassing the voltage-limiting mechanism except under test conditions. With the test device provided by the invention, the voltage supplied to the actuator is lowered during testing to a level which does not actually operate the actuator to remove the possibility of causing an erroneous operation and to readily confirm the normal operation of the actuator itself and the circuit which includes the actuator.

BRIEF DESCRIPTION OF THE DRAWINGS

In the drawings, the same symbols indicate the same or corresponding parts.

DESCRIPTION OF THE PREFERRED EMBODIMENTS

Figure 1:
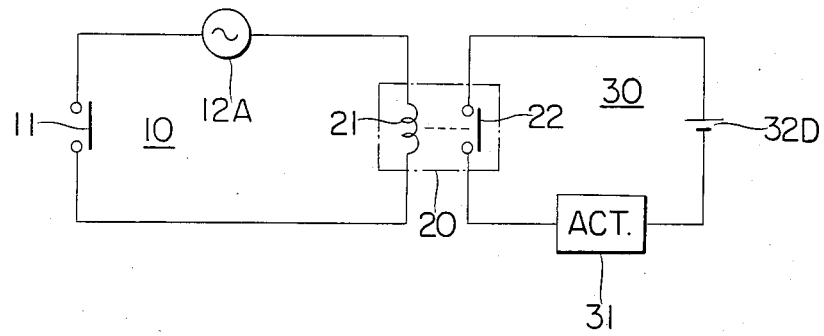
FIGS. 1 to 3 are circuit diagrams of a prior-art test device for testing an actuator.
Figure 2:
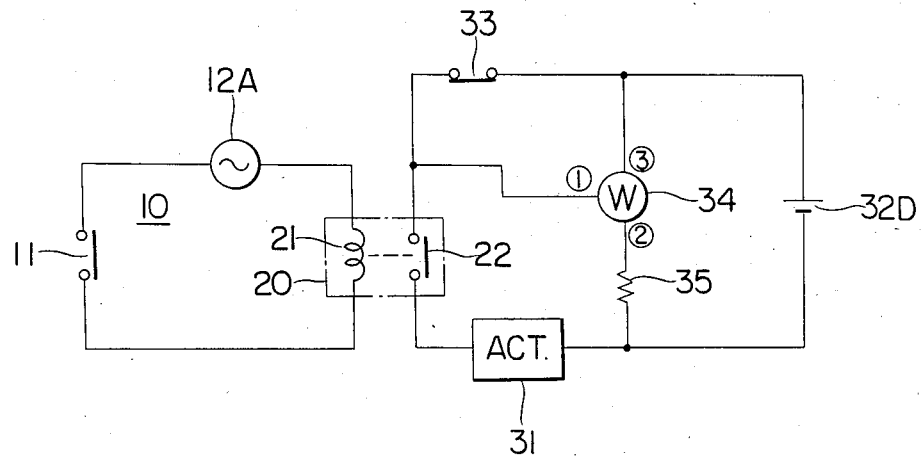

Now, an embodiment of this invention will be concretely described with reference to FIG. 4. Numerals 10, 11, 12A, 20, 21, 22, 33, 31, 32D, 37, and 38 designate the same parts as those indicated in FIG. 1 or 3. A distinguishing point of this embodiment over the prior art is that actuator applying voltage limiting means such as a voltage limiter 41D, e.g., a Zener diode and a normally closed switch 42 connected in parallel therewith is inserted into the actuator circuit 30 under test conditions.

The operation of the test device during ordinary conditions will first be described.

When the switch 11 is closed (ON position), the coil 21 of the relay 20 is energized so that the relay contacts are closed with the result that the actuator 31 is operated. Since the voltage limiter 41D is bypassed by the switch 42 in this case, it does not affect the operation of the actuator 31 does not affect any influence to the operation of the circuit.

Now, the operation of the test device at under test conditions will be described. The normally closed switch 42 is opened before the test is carried out. When the contact 22 of the relay are closed, the voltage ($V_0$-$V_Z$) applied to the actuator 31 is set to be a voltage lower than the minimum operating voltage $V_X$ of the actuator 31 (where $V_0$ represents the voltage of the power supply 32D for the actuator, and $V_Z$ represents the Zener voltage of the Zener diode of the voltage limiter 41D.). When the switch 11 is then closed (ON position), the relay coil 21 is energized so that the relay contacts 22 are closed, but the actuator 31 is not operated. Because the normally closed switch 42 is opened as described above so that the voltage limiter 41D is inserted into the actuator circuit 30, a voltage ($V_0$-$V_Z$) which is lower than the minimum operating voltage $V_X$ is applied to the actuator. The current at this time is detected by the current pickup 37, and the normal operation of the actuator 31 or the actuator circuit 30 is confirmed by the discriminating circuit 38.

Figure 3:
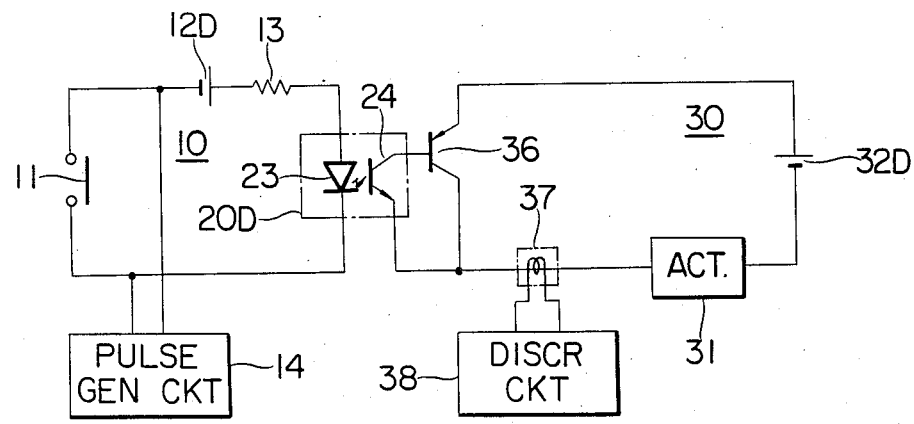
Figure 4:
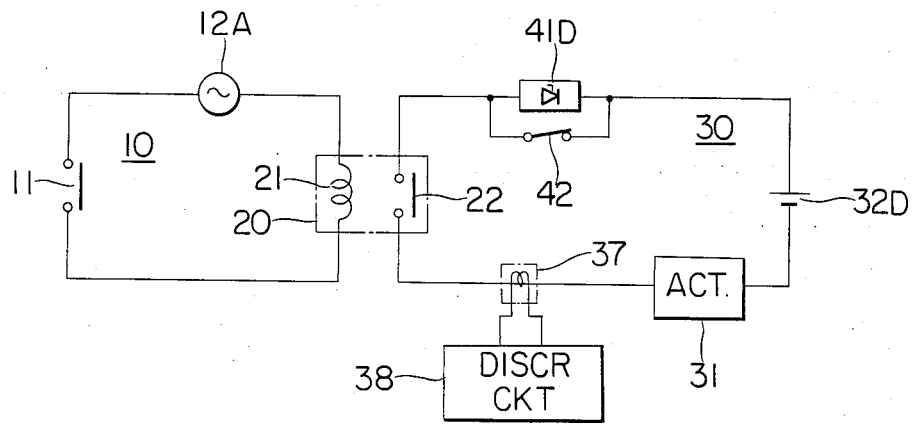
FIG. 4 is a circuit diagram showing an embodiment of a test device for testing an actuator according to the present invention.
Figure 5:
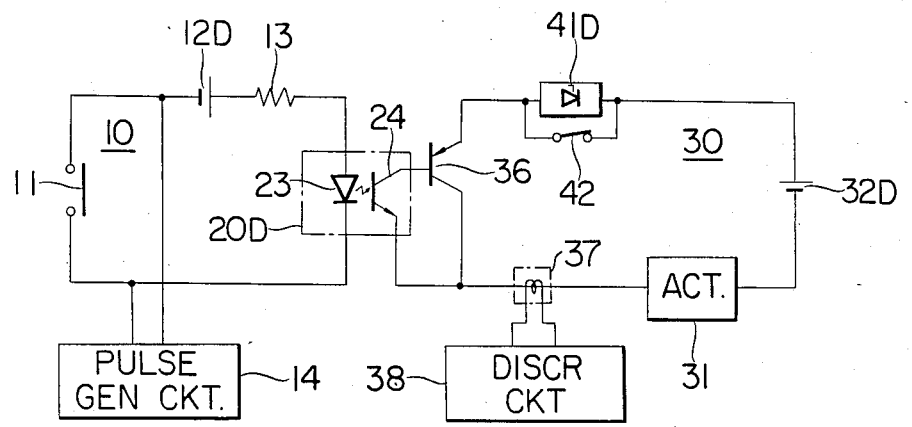
FIG. 5 is a circuit diagram showing another embodiment of this invention.

FIG. 5 shows another embodiment of a test device, to which the invention is applied to the prior-art test device in FIG. 3 wherein the parts are all the same as those in FIG. 3 or 4. When the switch 11 is closed (ON position) as described with reference to FIG. 3 so that the light emitting diode 23 in the photocoupler 20D emits a light, the phototransistor 24 conducts, the power transistor 36 accordingly conducts, and the actuator 31 operates.

At testing time, the normally closed switch 42 is opened. When the phototransistor 24 and the power transistor 36 are in the conductive state, a voltage which is lower than the minimum operating voltage is applied to the actuator 31. At the testing time, the switch 11 remains OFF. When the signal pulse is generated from the pulse generating circuit 14 which serves as a power supply under test conditions, the pulse current flows through the actuator circuit 30. This pulse current is detected by the current pickup 37, and the normal or abnormal operation of the actuator 31 is discriminated by the discriminating circuit 38 from the current value and the waveform of the pulse current. Since the voltage to be applied to the actuator 31 is lowered to ($V_0$-$V_Z$) which is below its operating voltage, the normal operation of the circuit can be confirmed using a pulse with sufficiently large pulse width to ordinarily operate the actuator. Further, when the voltage limiter 41D is composed of a plurality of Zener diodes connected in series with each other, there is no possibility that the actuator 31 will be accidentally operated due to a malfunction in the pulse generating circuit or in the voltage limiter, which might adversely affect the operation of the plant.

Figure 6:
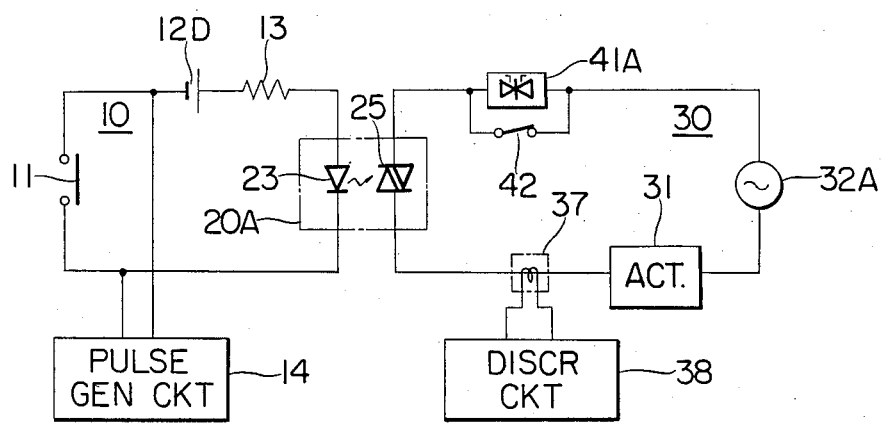
FIG. 6 is a circuit diagram showing still another embodiment of this invention.

FIG. 6 shows still another embodiment of this invention employing an actuator which is driven by an A.C. power supply and a photocoupler 20A for driving via an A.C. voltage (which consists of a light emitting diode 23 and a photothyristor 25) is used instead of the photocoupler 20D in FIG. 5. The power transistor 36 in FIG. 5 is not used, and an A.C. power supply 32A is used as a power supply for the actuator. Also an A.C. voltage limiter 41A is used as a power supply limiter. Since the normally closed switch 42 is ordinarily closed and the switch 11 is OFF, the actuator 31 is operated by closing the switch 11 to the ON position.

When the normally closed switch 42 is opened at testing time while the switch 11 remains OFF and a pulse signal is generated from a pulse generating circuit 14, the pulse current flows through the actuator circuit 30 which has an actuator 31, a power supply 32A for the actuator, an A.C. voltage limiter 41A and a photothyristor 25 in an A.C. drive photocoupler 20A, this pulse current is detected by the current pickup 37, and the normal operation of the circuit is confirmed by the discriminating circuit 27.

It is obvious that a similar effect can be obtained by employing a current limiter such as a resistor instead of the voltage limiter, thereby limiting the current flowing through the actuator at testing time to a value lower than the minimum operating current of the actuator.

As set forth above, according to this invention, the voltage limiter is inserted into the circuit at the testing time of the actuator or the circuit which includes the actuator and the voltage of the power supply is set equivalently to a value lower than the minimum operating voltage of the actuator, whereby the test device can be simplified and the possibility of accidental operation due to a malfunction of the test device can be actually eliminated.

What is claimed is:

1. A test device for testing an actuator circuit when the actuator in the circuit is turned off to determine whether the circuit is operating normally, the actuator circuit having an actuator power supply and a relay output in series with said actuator, said test device comprising a test circuit including a test circuit power supply, a relay input actuated by said test circuit power supply under test conditions and coupled to operate said relay output to connect said actuator power supply to said actuator, voltage limiting means in said actuator circuit for limiting the voltage applied to said actuator from said actuator power supply under test conditions when said relay output is operated, means for detecting characteristics of current flow in said actuator circuit under test conditions and for discriminating between normal and abnormal circuit operation, and means connected in parallel with said voltage limiting means for bypassing said voltage limiting means except under test conditions.

2. A test device according to claim 1 wherein said relay output comprises a transistor and said actuator circuit includes a power transistor connected to amplify the output from said transistor.

3. A test device according to claim 1 wherein said voltage limiting means is a voltage limiter.

4. A test device according to claim 1 wherein said voltage limiting means includes a Zener diode.

5. A test device according to claim 1 wherein said voltage limiting means includes a plurality of Zener diodes connected in series with each other.

6. A test device according to claim 1 wherein said voltage limiting means is a current limiter.

7. A test device according to claim 6 wherein said current limiter is a resistor.

8. A test device according to claim 1 wherein said test circuit includes an on-off switch in series with said test circuit power supply and said relay input.

9. A test device according to claim 1 wherein said actuator is operated by a power supply pulse of predetermined width and said test circuit power supply includes a pulse generating circuit operable under test conditions for generating a signal pulse having a pulse width less than said predetermined width.

10. A test device according to claim 1 wherein said bypassing means comprises a normally closed switch which is opened under test conditions.

* * * * *